United States Patent
Morrow et al.

(10) Patent No.: US 11,264,493 B2
(45) Date of Patent: Mar. 1, 2022

(54) WRAP-AROUND SOURCE/DRAIN METHOD OF MAKING CONTACTS FOR BACKSIDE METALS

(71) Applicant: Intel Corporation, Santa Clara, CA (US)

(72) Inventors: Patrick Morrow, Portland, OR (US); Kimin Jun, Hillsboro, OR (US); Il-Seok Son, Portland, OR (US); Donald W. Nelson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 15/747,423

(22) PCT Filed: Sep. 25, 2015

(86) PCT No.: PCT/US2015/052382
§ 371 (c)(1),
(2) Date: Jan. 24, 2018

(87) PCT Pub. No.: WO2017/052630
PCT Pub. Date: Mar. 30, 2017

(65) Prior Publication Data
US 2018/0219090 A1    Aug. 2, 2018

(51) Int. Cl.
*H01L 29/78*    (2006.01)
*H01L 23/14*    (2006.01)
(Continued)

(52) U.S. Cl.
CPC ............ *H01L 29/78* (2013.01); *H01L 23/147* (2013.01); *H01L 23/3107* (2013.01);
(Continued)

(58) Field of Classification Search
CPC ... H01L 29/78; H01L 29/41791; H01L 24/00; H01L 24/05; H01L 23/49827;
(Continued)

(56) References Cited

U.S. PATENT DOCUMENTS

| | | |
|---|---|---|
| 8,426,888 B2 | 4/2013 | Molin |
| 8,753,964 B2 | 6/2014 | Bryant et al. |

(Continued)

FOREIGN PATENT DOCUMENTS

| | | |
|---|---|---|
| CN | 103348481 | 10/2013 |
| WO | WO-2014/209278 A1 * | 12/2014 |

OTHER PUBLICATIONS

International Search Report and Written Opinion for International Patent Application No. PCT/US2015/052382 dated Jun. 20, 2016, 11 pgs.
(Continued)

*Primary Examiner* — Bitew A Dinke
(74) *Attorney, Agent, or Firm* — Schwabe, Williamson & Wyatt P.C.

(57) ABSTRACT

An apparatus including a circuit structure including a first side including a device layer including a plurality of devices and an opposite second side; an electrically conductive contact coupled to one of the plurality of devices on the first side; and an electrically conductive interconnect disposed on the second side of the structure and coupled to the conductive contact. A method including forming a transistor device including a channel between a source and a drain and a gate electrode on the channel defining a first side of the device; forming an electrically conductive contact to one of the source and the drain from the first side; and forming an interconnect on a second side of the device, wherein the interconnect is coupled to the contact.

12 Claims, 15 Drawing Sheets

(51) Int. Cl.
*H01L 23/31* (2006.01)
*H01L 23/498* (2006.01)
*H01L 23/00* (2006.01)
*H01L 29/417* (2006.01)
*H01L 23/15* (2006.01)

(52) U.S. Cl.
CPC ........ *H01L 23/49827* (2013.01); *H01L 24/00* (2013.01); *H01L 24/05* (2013.01); *H01L 29/41791* (2013.01); *H01L 23/145* (2013.01); *H01L 23/15* (2013.01); *H01L 2224/0237* (2013.01); *H01L 2224/04105* (2013.01); *H01L 2224/0603* (2013.01); *H01L 2224/16227* (2013.01)

(58) Field of Classification Search
CPC ............... H01L 23/3107; H01L 23/147; H01L 2224/16227; H01L 2224/0603; H01L 2224/04105; H01L 23/15; H01L 23/145; H01L 2224/0237
See application file for complete search history.

(56) References Cited

U.S. PATENT DOCUMENTS

| | | | |
|---|---|---|---|
| 9,640,531 B1* | 5/2017 | Or-Bach | H01L 27/0688 |
| 10,325,840 B2* | 6/2019 | Nelson | H01L 23/49827 |
| 10,367,070 B2* | 7/2019 | Morrow | H01L 29/7851 |
| 2005/0042867 A1* | 2/2005 | Sanchez | H01L 21/76838 438/684 |
| 2007/0001219 A1 | 1/2007 | Radosavljevic et al. | |
| 2008/0054313 A1* | 3/2008 | Dyer | G03F 9/7084 257/276 |
| 2008/0206977 A1* | 8/2008 | Frank | H01L 21/76898 438/597 |
| 2010/0032808 A1* | 2/2010 | Ding | H01L 21/6835 257/621 |
| 2010/0140710 A1* | 6/2010 | Kuroda | H01L 21/84 257/350 |
| 2010/0230735 A1* | 9/2010 | Zhu | H01L 27/10805 257/301 |
| 2010/0244187 A1* | 9/2010 | Voldman | H01L 23/481 257/531 |
| 2012/0086045 A1 | 4/2012 | Molin | |
| 2012/0088339 A1* | 4/2012 | Molin | H01L 29/66734 438/138 |
| 2012/0231620 A1* | 9/2012 | Kuroda | H01L 21/74 438/586 |
| 2013/0020662 A1 | 1/2013 | Kao | |
| 2013/0105868 A1 | 5/2013 | Kalnitsky | |
| 2013/0299897 A1* | 11/2013 | Doris | H01L 29/66477 257/330 |
| 2014/0070320 A1 | 3/2014 | Mukherjee et al. | |
| 2014/0264632 A1 | 9/2014 | Richter et al. | |
| 2014/0332749 A1* | 11/2014 | Yokoyama | H01L 21/823431 257/4 |
| 2014/0342529 A1* | 11/2014 | Goktepeli | H01L 27/1203 438/458 |
| 2015/0060967 A1* | 3/2015 | Yokoyama | H01L 27/1464 257/292 |
| 2015/0069523 A1* | 3/2015 | Or-Bach | H01L 24/25 257/390 |
| 2015/0206936 A1* | 7/2015 | Huang | H01L 29/7824 257/402 |
| 2015/0235949 A1* | 8/2015 | Yu | H01L 25/0657 257/774 |
| 2015/0311142 A1* | 10/2015 | Sekar | H01L 23/3677 257/499 |
| 2016/0034620 A1* | 2/2016 | Kawa | G06F 17/5009 716/136 |
| 2016/0035722 A1* | 2/2016 | Or-Bach | H01L 29/456 257/504 |
| 2016/0141274 A1* | 5/2016 | Or-Bach | H01L 25/0657 257/659 |
| 2016/0197069 A1* | 7/2016 | Morrow | H01L 21/823431 257/393 |
| 2016/0204088 A1* | 7/2016 | Fong | H01L 21/76254 438/107 |
| 2018/0212057 A1* | 7/2018 | Lilak | H01L 29/1054 |
| 2018/0219075 A1* | 8/2018 | Morrow | H01L 29/78 |
| 2018/0286916 A1* | 10/2018 | Wang | H01L 45/04 |
| 2018/0315838 A1* | 11/2018 | Morrow | H01L 29/66545 |
| 2018/0323174 A1* | 11/2018 | Mueller | H01L 21/76838 |
| 2019/0006296 A1* | 1/2019 | Morrow | H01L 23/645 |
| 2019/0019693 A1* | 1/2019 | Or-Bach | H01L 23/34 |
| 2019/0096917 A1* | 3/2019 | Morrow | H01L 29/66356 |
| 2019/0157310 A1* | 5/2019 | Glass | H01L 21/823431 |
| 2019/0221649 A1* | 7/2019 | Glass | H01L 23/481 |
| 2019/0259699 A1* | 8/2019 | Morrow | H01L 23/528 |

OTHER PUBLICATIONS

International Preliminary Search Report for International Patent Application No. PCT/US2015/052382, dated Apr. 5, 2018, 10 pages.
Office Action for Taiwan Patent Application No. 105125786. dated Nov. 11, 2019, 25 pages.
Office Action for Taiwan Patent Application No. 105125786. dated Feb. 21, 2020, 13 pages.
Office Action for Taiwan Patent Application No. 105125786. dated Jul. 14, 2020, 12 pages.
Office Action for Chinese Patent Application No. 201580083367.7. dated Dec. 14, 2020, 10 pgs.
Second Office Action for Chinese Patent Application No. 201580083367.7. dated Jun. 30, 2021, 17 pgs.
Office Action from Chinese Patent Application No. 201580083367.7, dated Nov. 11, 2021, 6 pgs.

\* cited by examiner

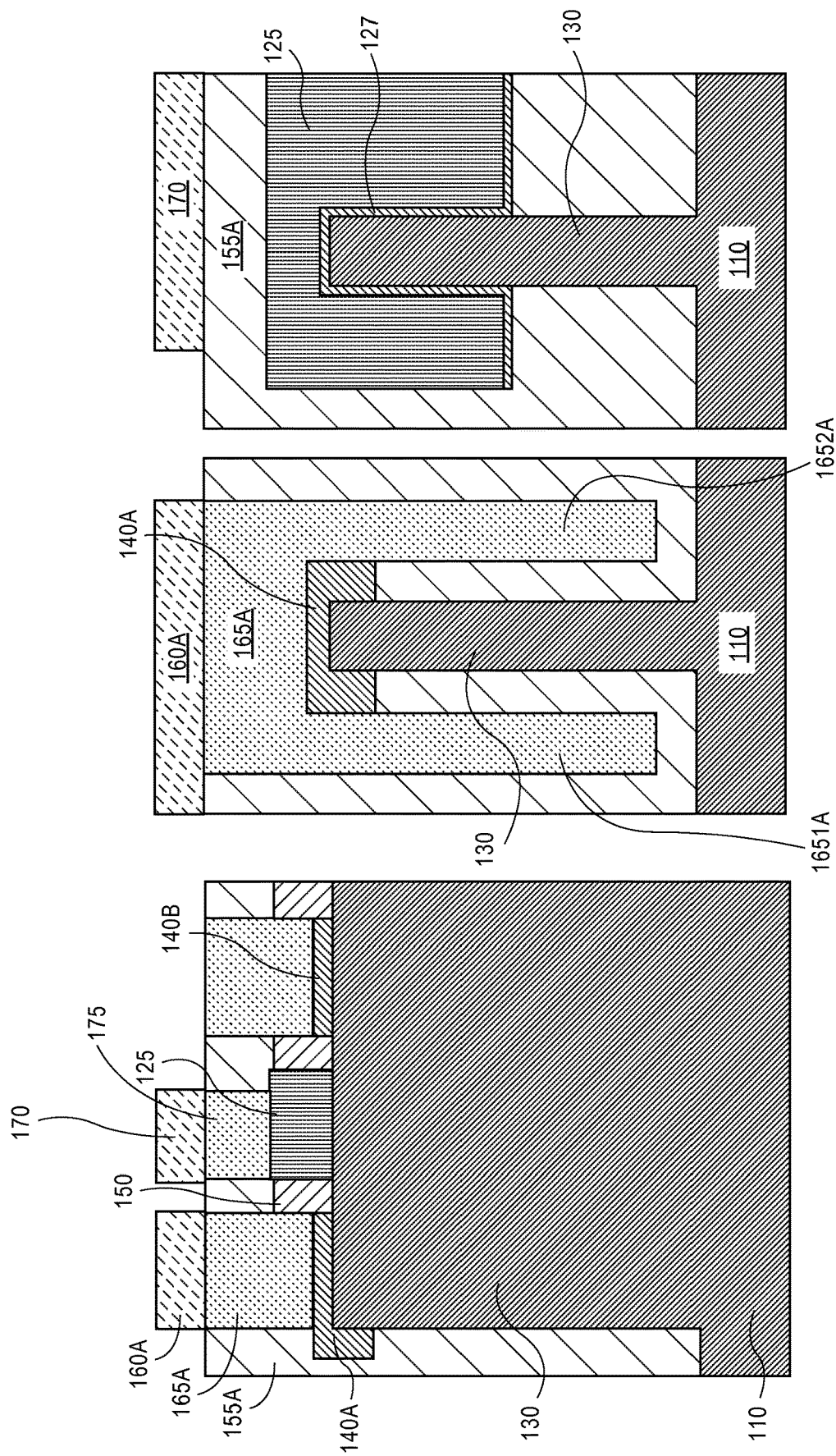

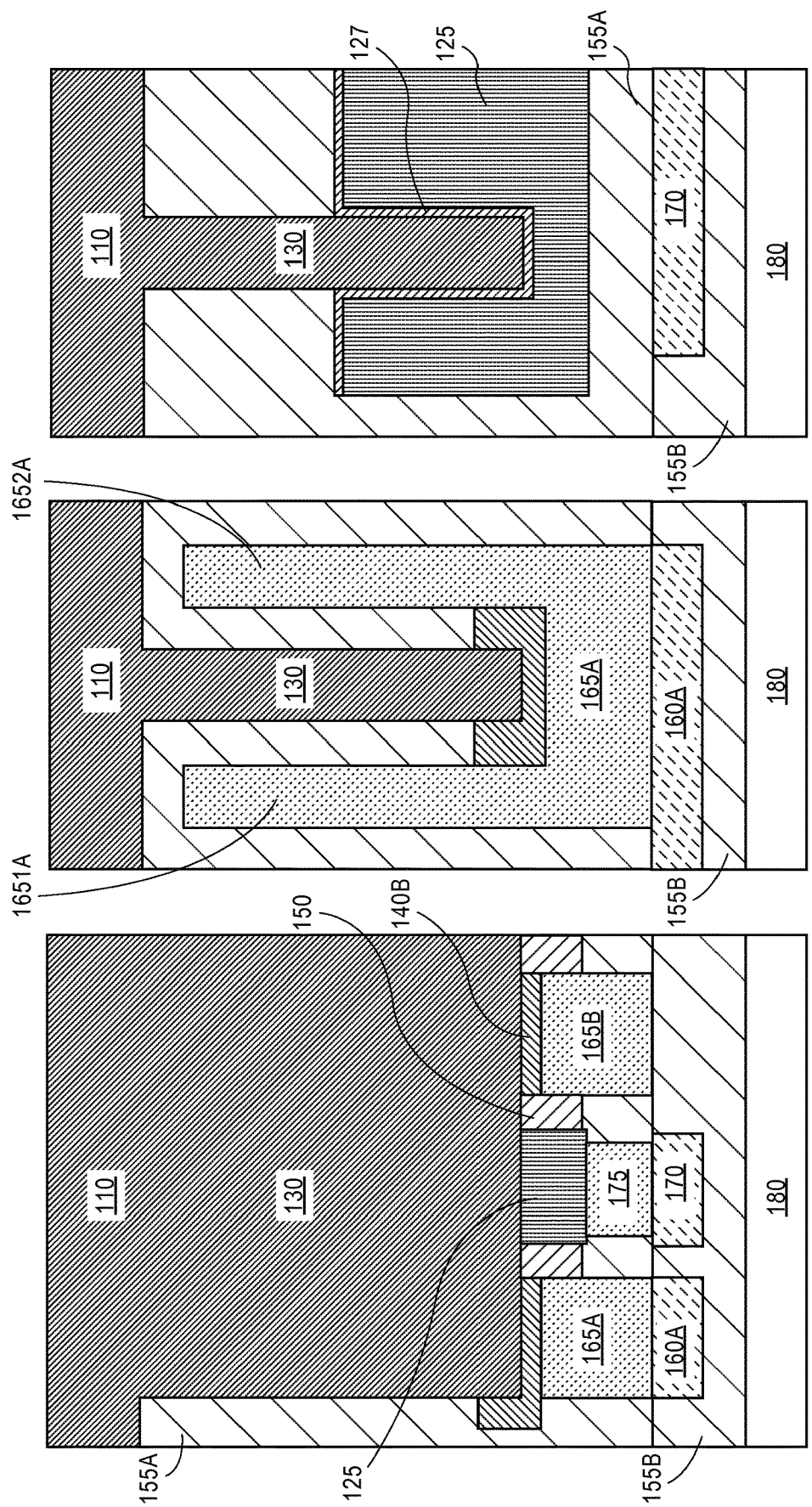

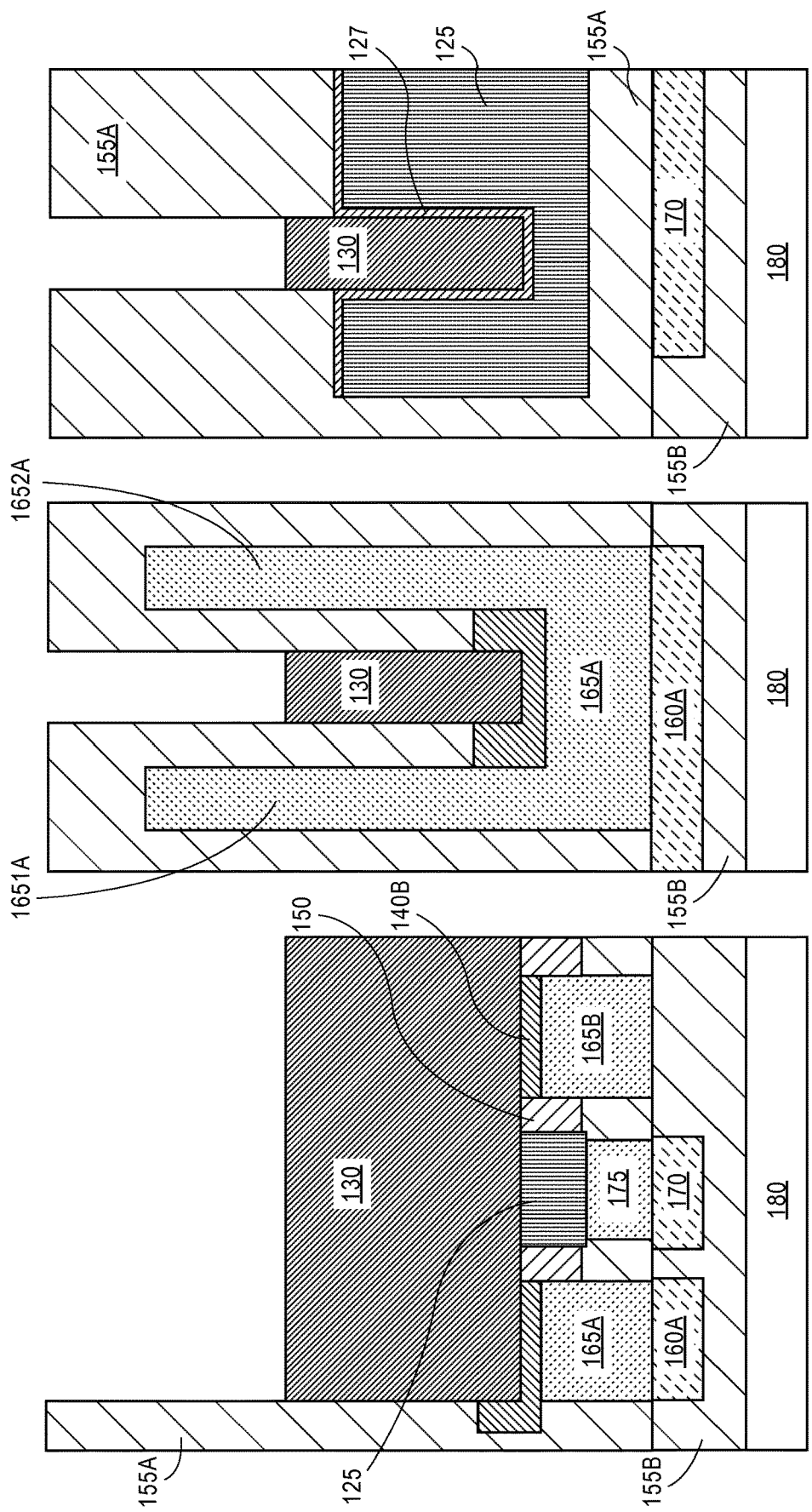

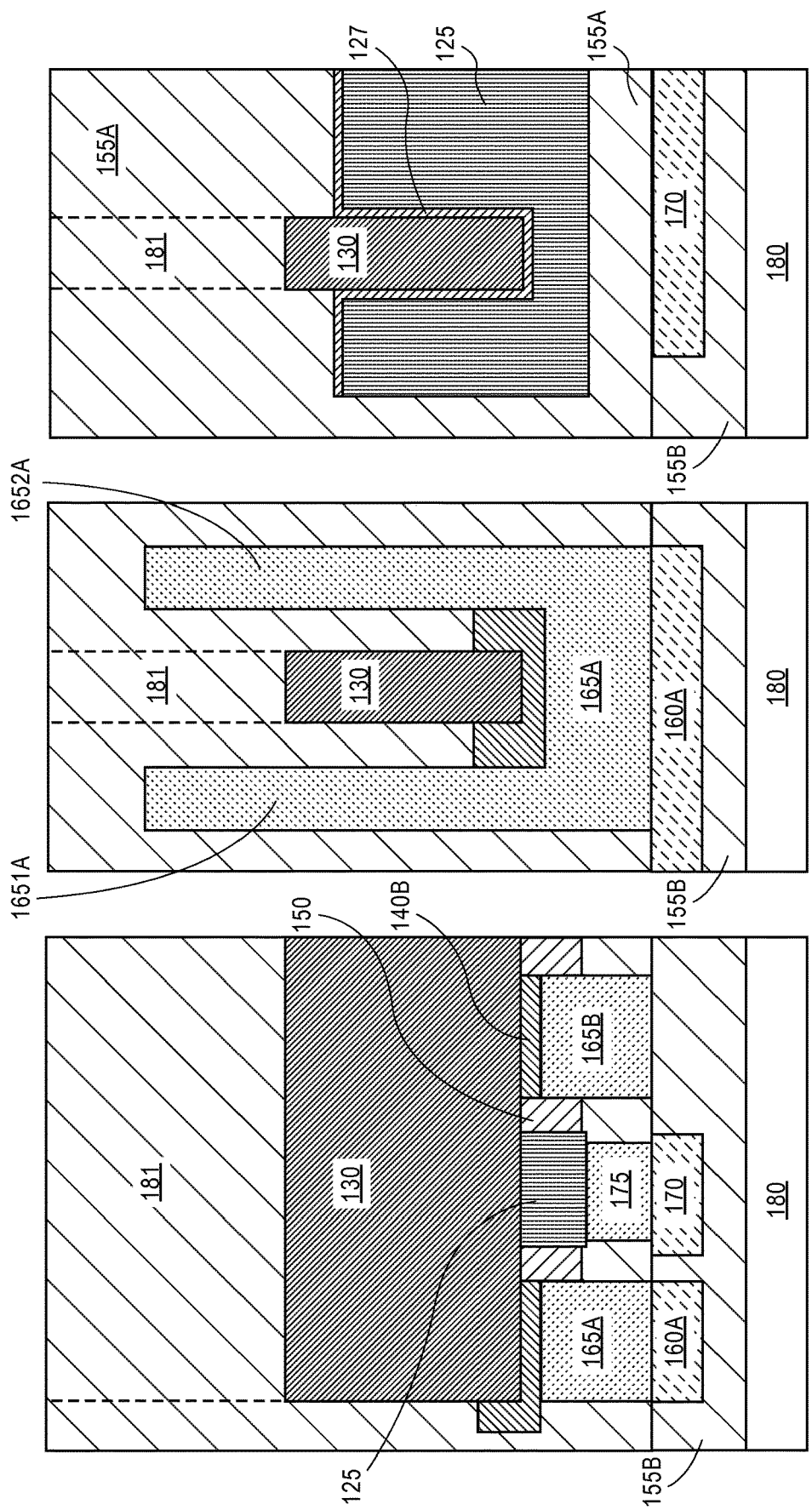

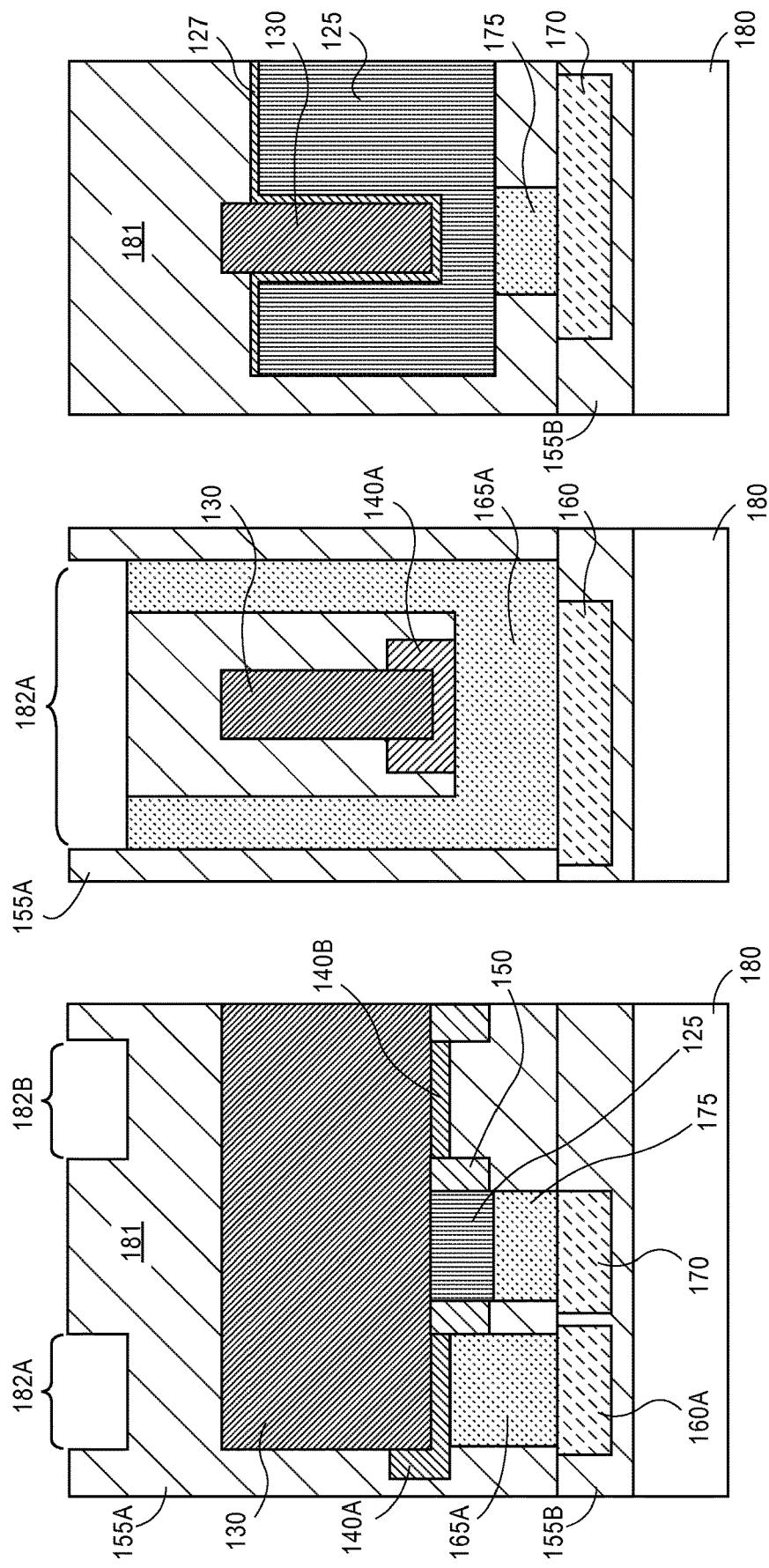

WRAP-AROUND SOURCE/DRAIN METHOD OF MAKING CONTACTS FOR BACKSIDE METALS

CROSS-REFERENCE TO RELATED APPLICATION

This patent application is a U.S. National Phase Application under 35 U.S.C. § 371 of International Application No. PCT/US2015/052382, filed Sep. 25, 2015, entitled "WRAP-AROUND SOURCE/DRAIN METHOD OF MAKING CONTACTS FOR BACKSIDE METALS," which designates the United States of America, the entire disclosure of which is hereby incorporated by reference in its entirety and for all purposes.

TECHNICAL FIELD

Semiconductor devices including devices having electrical connections from a backside of the device.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Future circuit devices, such as central processing unit devices, will desire both high performance devices and low capacitance, low power devices integrated in a single dye or chip.

BRIEF DESCRIPTION OF THE DRAWINGS

FIGS. 5A-5C show cross-sectional side views through the structure of FIG. 4.

FIGS. 6A-6C show the structure of FIGS. 5A-5C following the inverting or flipping of the structure and connection of the structure to a carrier.

FIGS. 7A-7C show the structure of FIGS. 6A-6C following the removal or thinning of the substrate to expose a second side or backside of a fin of the device.

FIGS. 8A-8C shows the structure of FIGS. 7A-7C following the deposition of a dielectric material on a backside of the transistor device.

FIGS. 9A-9C show the structure of FIGS. 8A-8C following the patterning of the dielectric material on the backside of the transistor device.

DETAILED DESCRIPTION

The embodiments described herein are directed to semiconductor devices including non-planar semiconductor devices (e.g., three-dimensional devices) having interconnects or wiring below or on a backside of the devices. Such embodiments are achieved by using backside reveal and backside processing. The embodiments described include an apparatus including a circuit structure comprising a first side including a device layer including a plurality of devices and an opposite second side; an electrically conductive contact coupled to one of the plurality of devices on the first side; and an electrically conductive interconnect disposed on the second side and connected to the conductive contact. Embodiments of forming such devices are also described. Backside reveal processing allows flexibility in the type of connections that can be fabricated.

FIGS. 1-10C describe a method or process of forming a three-dimensional or non-planar semiconductor device including electrical connections on a non-device side or backside of the structure. In one embodiment, the device is a three-dimensional metal oxide semiconductor field effect transistor (MOSFET) and is an isolated device or is one device in a plurality of nested devices. As will be appreciated, for a typical integrated circuit, both N- and P-channel transistors may be fabricated on a single substrate to form a complimentary metal oxide semiconductor (CMOS) integrated circuit. Furthermore, additional interconnects may be fabricated in order to integrate such devices into an integrated circuit.

In the fabrication of non-planar transistors, such as multi-gate transistors and FinFETs, non-planar semiconductor bodies may be used to form transistors generally capable of full depletion with relatively small gate lengths (e.g., less than about 30 nm). These semiconductor bodies are generally fin-shaped and are, thus, generally referred to as transistor "fins". For example in a tri-gate transistor, the transistor fin has a top surface and two opposing sidewalls formed on a bulk semiconductor substrate or a silicon-on-insulator substrate. A gate dielectric may be formed on the top or superior surface and sidewalls of the semiconductor body and a gate electrode may be formed over the gate dielectric on the top or superior surface of the semiconductor body and adjacent to the gate dielectric on the sidewalls of the semiconductor body. Since the gate dielectric and the gate electrode are adjacent to three surfaces of the semiconductor body, three separate channels and gates are formed.

As there are three separate channels formed, the semiconductor body can be fully depleted when the transistor is turned on. With regard to finFET transistors, the gate material and the electrode contact the sidewalls of the semiconductor body, such that two separate channels are formed.

Figure 1:
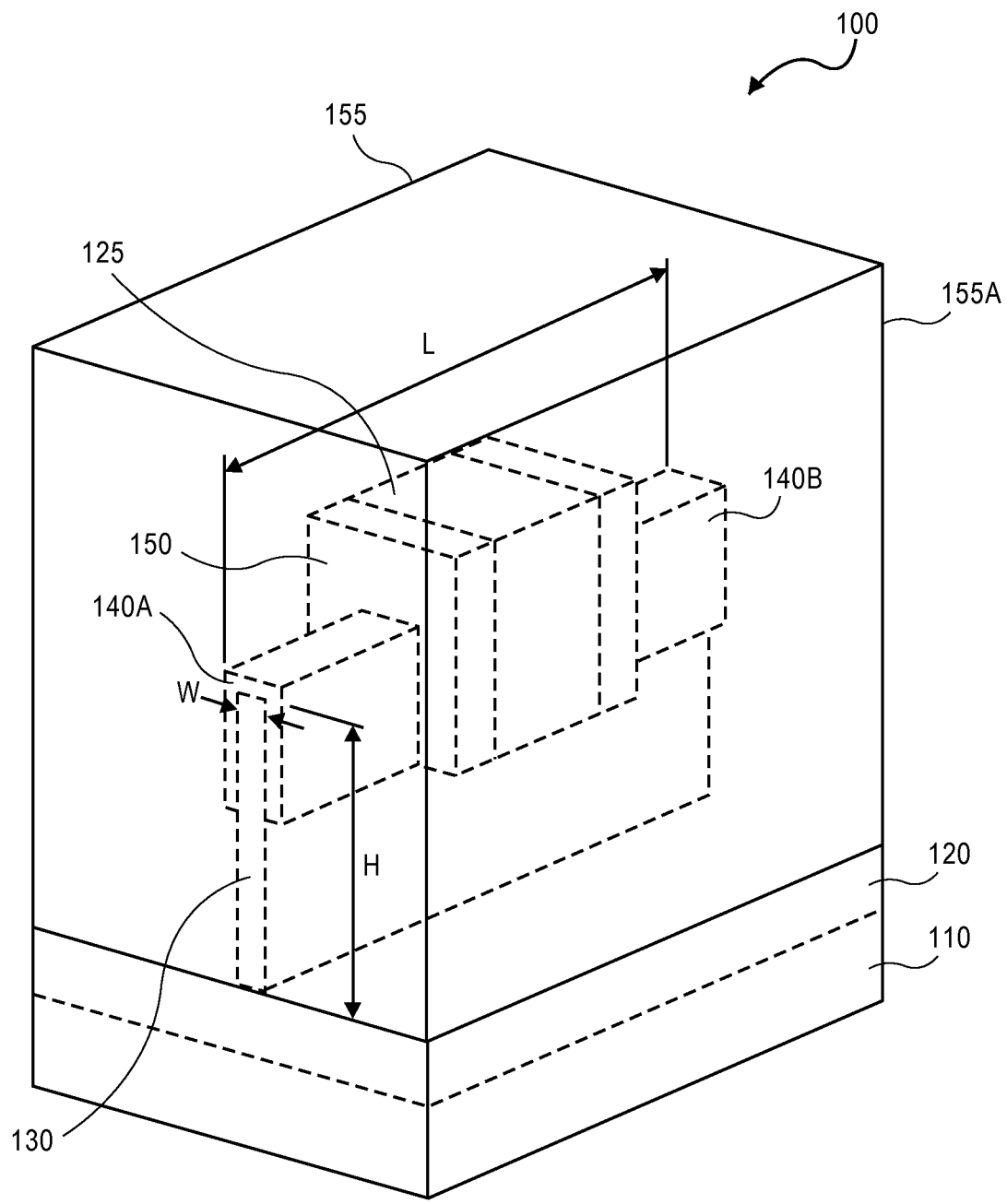
FIG. 1 shows a top side perspective view of a portion of a three-dimensional transistor device on a substrate that is, for example, a portion of an integrated circuit die or chip on a wafer.

FIG. 1 shows a top side perspective view of a portion of a semiconductor or semiconductor-on-insulator (SOI) substrate that is, for example, a portion of an integrated circuit die or chip on a wafer. Specifically, FIG. 1 shows structure 100 including substrate 110 of silicon or SOI. Overlaying substrate 110 is optional buffer layer 120. In one embodiment, a buffer layer is a silicon germanium buffer introduced, in one embodiment, on substrate 110 by a growth technique. Representatively, buffer layer 120 has a representative thickness on the order of a few hundred nanometers (nm).

Disposed on a surface of substrate 110 and optional buffer layer 120 in the embodiment illustrated in FIG. 1 (an upper surface as viewed), is a portion of a transistor device such as an N-type transistor device or a P-type transistor device. Common to an N-type or P-type transistor device, in this embodiment, is body or fin 130 disposed on a surface of buffer layer 120. In one embodiment, fin 130 is formed of a semiconductor material such as silicon, silicon germanium or a group III-V or group IV-V semiconductor material. In one embodiment, a material of fin 130 is formed according to conventional processing techniques for forming a three-dimensional integrated circuit device. Representatively, a semiconductor material is epitaxially grown on the substrate and then formed into fin 130 (e.g., by a masking and etch process).

In one embodiment, fin 130 has a length dimension, L, greater than a height dimension, H. A representative length range is on the order of 10 nanometers (nm) to 1 millimeter (mm), and a representative height range is on the order of 5 nm to 200 nm. Fin 130 also has a width, W, representatively on the order of 4-10 nm. As illustrated, fin 130 is a three-dimensional body extending from or on a surface of substrate 110 (or optionally from or on buffer layer 120). The three-dimensional body as illustrated in FIG. 1 is a rectangular body with opposing sides (first and second sides) projecting from a surface of buffer layer 120 as viewed. It is appreciated that in processing of such bodies, a true rectangular form may not be achievable with available tooling, and other shapes may result. Representative shapes include, but are not limited to, a trapezoidal shape (e.g., base wider than top) and an arch shape.

Disposed on fin 130 in the embodiment of a structure of FIG. 1 is a gate stack. In one embodiment, a gate stack includes a gate dielectric layer of, for example, silicon dioxide or a dielectric material having a dielectric constant greater than silicon dioxide (a high k dielectric material). Disposed on the gate dielectric layer, in one embodiment, is gate 125 of, for example, a metal. The gate stack may include spacers 150 of dielectric material on opposite sides thereof. A representative material for spacers 150 is a low k material such as silicon nitride (SiN) or silicon carbon nitrogen (SiCN). FIG. 1 shows spacers 150 adjacent the sidewalls of the gate stack and on the fin 130. Formed on or in fin 130 on opposite sides of the gate stack are junction regions (source 140A and drain 140B).

In one embodiment, to form the three-dimensional transistor structure, a gate dielectric material is formed on fin 130 such as by way of a blanket deposition followed by a blanket deposition of a sacrificial or dummy gate material. A mask material is introduced over the structure and patterned to protect the gate stack material (gate stack with sacrificial or dummy gate material) over a designated channel region. An etch process is then used to remove the gate stack material in undesired areas and pattern the gate stack over a designated channel region. Spacers 150 are then formed. One technique to form spacers 150 is to deposit a film on the structure, protect the film in a desired area and then etch to pattern the film into desired spacer dimensions.

Following the formation of a gate stack including a sacrificial or dummy gate material on fin 130 and spacers 150, junction regions (source and drain) are formed on or in fin 130. The source and drain are formed in fin 130 on opposite sides of the gate stack (sacrificial gate electrode on gate dielectric). In the embodiment shown in FIG. 1, source 140A and drain 140B are formed by epitaxially growing source and drain material as a cladding on a portion of fin 130. Representative material for source 140A and drain 140B includes, but is not limited to, silicon, silicon germanium, or a group III-V or group IV-V compound semiconductor material. Source 140A and drain 140B may alternatively be formed by removing portions of the fin material and epitaxially growing source and drain material in designated junction regions where fin material was removed.

Following the formation of source 140A and drain 140B, in one embodiment, the sacrificial or dummy gate is removed and replaced with a gate electrode material. In one embodiment, prior to removal of the sacrificial or dummy gate stack, a dielectric material is deposited on the structure. In one embodiment, dielectric material is silicon dioxide or a low k dielectric material deposited as a blanket and then polished to expose sacrificial or dummy gate 125. The sacrificial or dummy gate and gate dielectric are then removed by, for example, an etch process.

Following a removal of the sacrificial or dummy gate and gate dielectric, a gate stack is formed in a gate electrode region. A gate stack is introduced, e.g., deposited, on the structure including a gate dielectric and gate electrode. In an embodiment, gate electrode 125 of the gate electrode stack is composed of a metal gate and a gate dielectric layer is composed of a material having a dielectric constant greater than a dielectric constant of silicon dioxide (a high-k material). For example, in one embodiment, gate dielectric layer 127 (see FIG. 3C) is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In one embodiment, gate electrode 125 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. Following the formation of the gate stack, additional dielectric material dielectric material of silicon dioxide or a low k dielectric material is deposited on the three-dimensional transistor device (e.g., on ILD0) to encapsulate or embed the device structure in dielectric material. FIG. 1 shows dielectric material 155A encapsulating the three-dimensional transistor device (e.g., as an ILD0).

Figure 2:
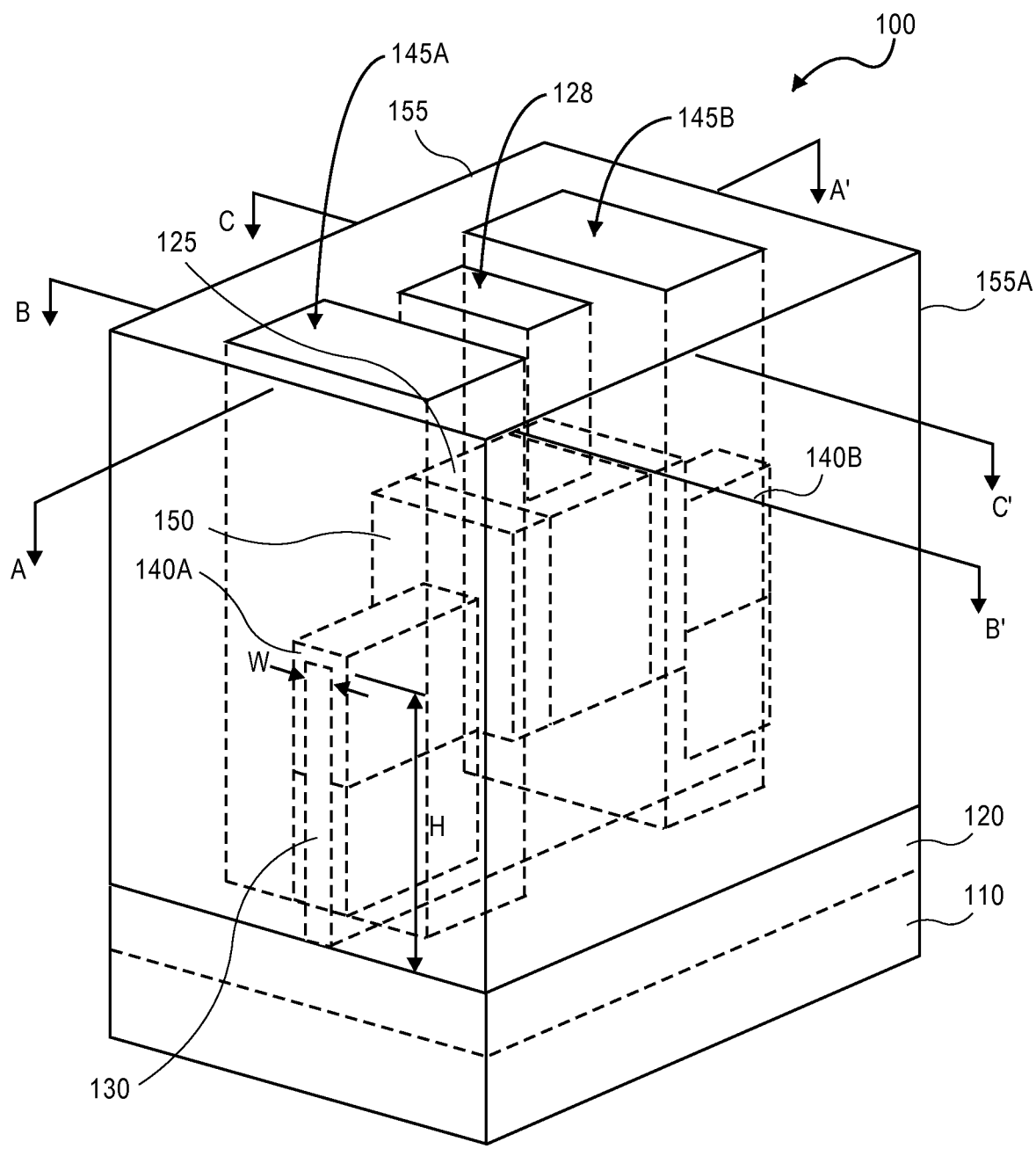
FIG. 2 shows the structure of FIG. 1 following the formation of contact openings or vias to the transistor device.
Figure 3:
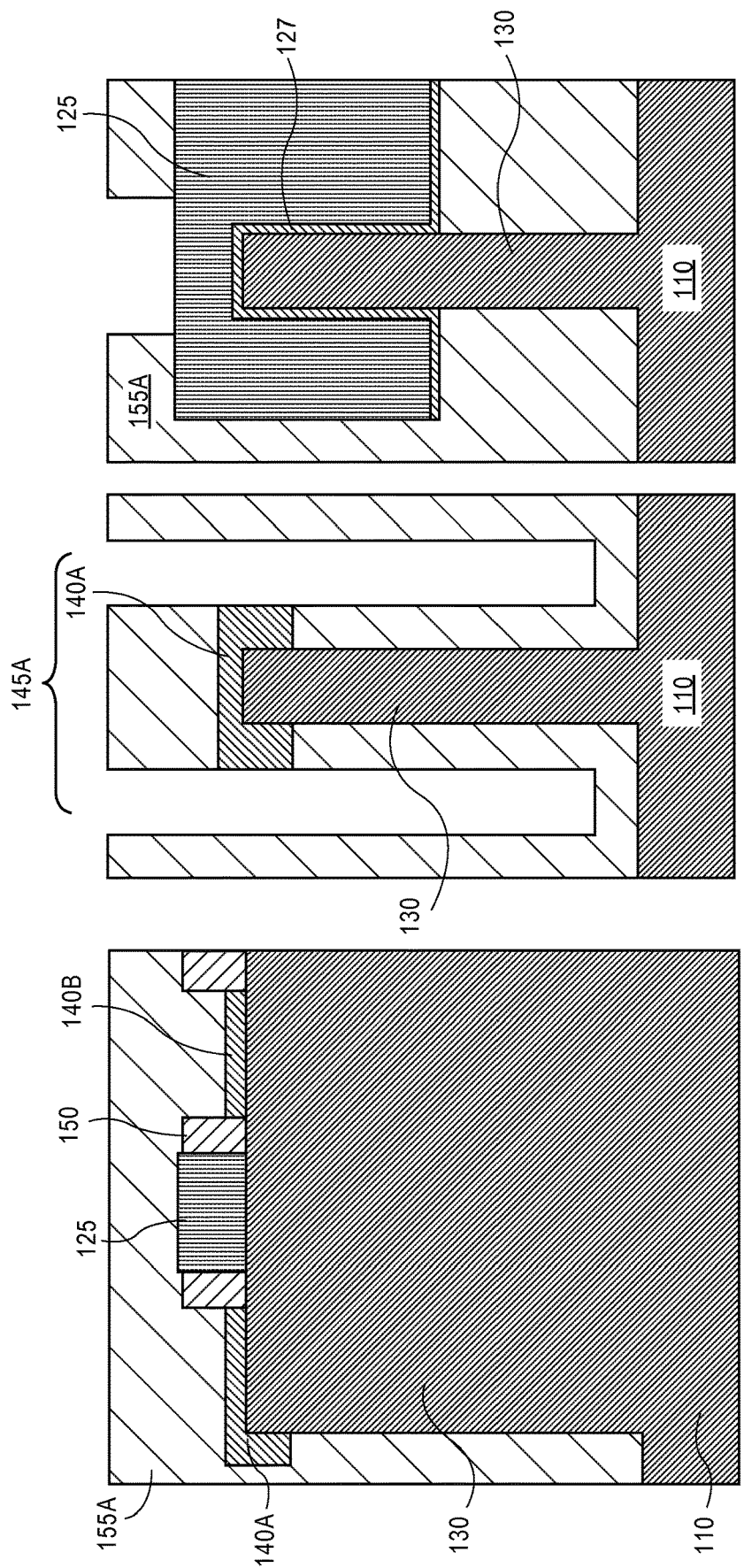
FIGS. 3A-3C show cross-sectional sideview through the structure of FIG. 2.

FIG. 2 shows the structure of FIG. 1 following forming openings or vias through dielectric material to expose source 140A and drain 140B. In one embodiment, opening 145A around the source region and opening 145B around the drain region are formed by a lithography process such as by masking an area of a top surface of dielectric material (as viewed) to define areas for openings and etching openings or vias through dielectric material 155A with an etchant selective for the dielectric material relative to a material for source 140A and drain 140B. As FIG. 2 illustrates, in one embodiment, an etch area is large enough to form opening 145A and opening 145B in a manner that exposes a top surface of source 140A and drain 140B, respectively, as well as opposing side surface of the source and drain. The etch, in one embodiment, is an anisotropic etch that proceeds to a depth beyond a depth of the respective source and drain. Since, in this embodiment, source 140A and drain 140B are formed as a cladding on a top surface and sidewall surfaces of fin 130, the source and drain will act as a mask as the etch proceeds through dielectric material 155A beyond source 140 and drain 140B to leave dielectric material directly on and adjacent opposing sidewalls of fin 130 below source 140A and drain 140B, respectively. In one embodiment, the etch proceeds through dielectric material 155A to a depth near the base of fin 130. In addition to opening 145A in a source region and opening 145B in a drain region, FIG. 2 shows via or opening 128 formed through dielectric material 155A to gate electrode 125. Opening 128 may be formed by a similar mask and etch process as openings 145A and 145B and, in this embodiment, exposes a portion of the top of gate electrode 125.

FIGS. 3A-3C show cross-sectional side views through FIG. 2. More specifically, FIG. 3A shows a cross-sectional side view through line A-A' of FIG. 2 which is a cross-section through fin 130; FIG. 3B shows a cross-section through line B-B' which is a cross-section through source 140A; and FIG. 3C shows a cross-section through line C-C' which is a cross-section through gate electrode 125. The same orientation of cross-sections (A-C) will be presented throughout this description. FIG. 3B shows opening or via 145A exposing a top surface and opposing side surfaces of source 140A and proceeding to a depth near a base of fin 130 which FIG. 3C shows an opening to gate electrode 125.

Figure 4:
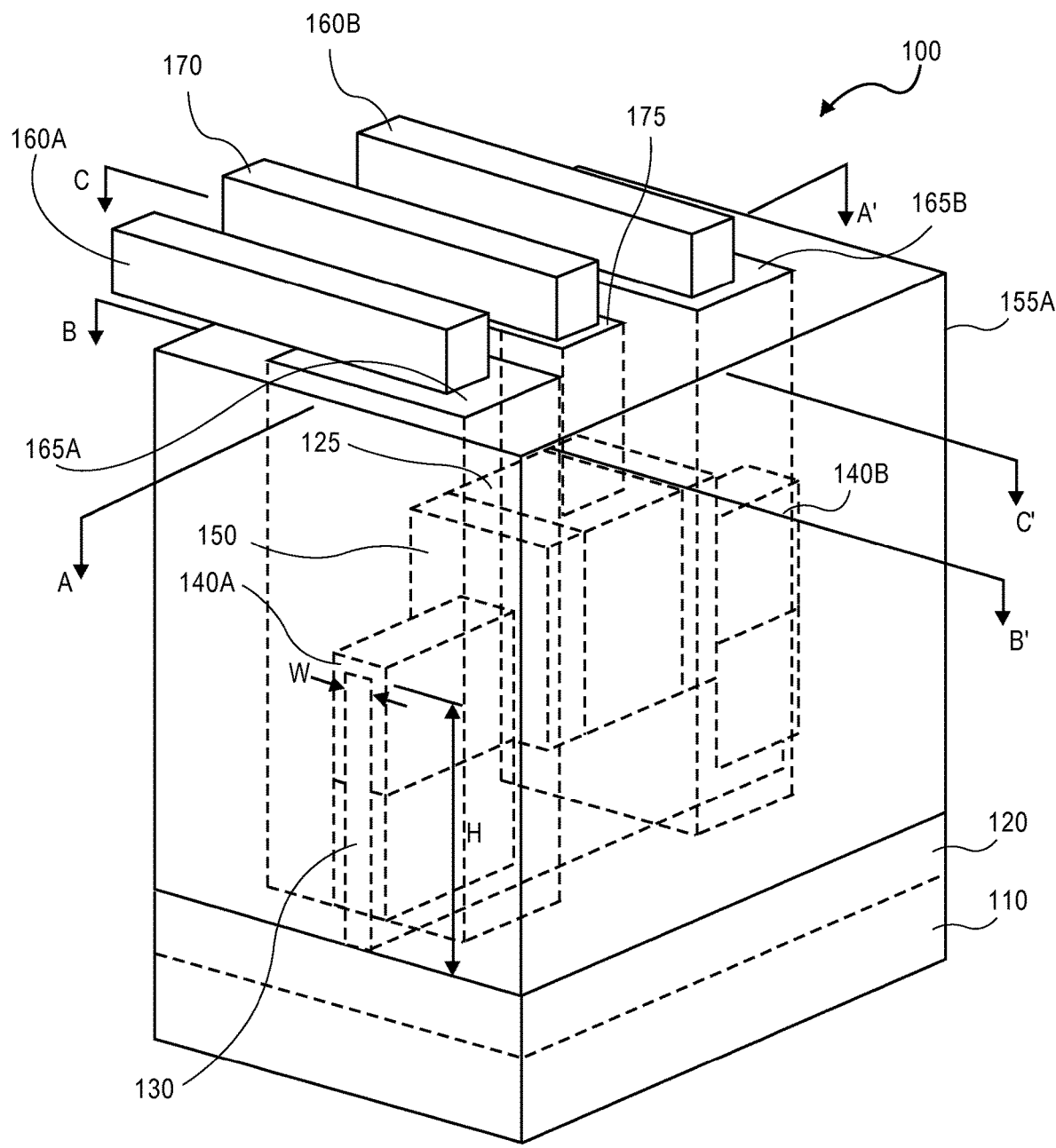
FIG. 4 shows the structure of FIG. 2 following the forming of contacts and interconnects to the three-dimensional transistor device structure.

FIG. 4 shows the structure of FIG. 1 following the forming of contacts and interconnects to the three-dimensional transistor device structure. In this embodiment, an electrical connection is made as a first interconnect layer or metal layer to source 140A, drain 140B and gate electrode 125. Representatively, to form individual electrical contacts to source 140A, drain 140B and gate electrode 125, a contact material of, for example, tungsten is introduced (e.g., deposited) in openings 128, 145A and 145B and the openings are filled to form contact 165A to source 140A, contact 165B to drain 140B and contact 175 to gate electrode 125. A surface of dielectric material 155 (a top surface as viewed) may then be seeded with a conductive seed material and then patterned with masking material to define openings for interconnect paths with respective openings exposing contact 165A, contact 165B and contact 175. A conductive material such as copper is then introduced by way of an electroplating process to form interconnect 160A connected to contact 165A to source 140A, interconnect 160B connected to contact 165B and interconnect 170 connected to contact 175 of gate electrode 125. The masking material and unwanted seed material can then be removed. Following the formation of interconnects as an initial metal layer, a dielectric material of for example, silicon dioxide or a low k dielectric material may be deposited as an ILD1 layer on and around the interconnects. Additional interconnect layers may then be formed according to conventional processes.

FIGS. 5A-5C show cross-sectional side views through the structure of FIG. 4. Specifically, FIG. 5A shows a cross-section through line A-A' through fin 130; FIG. 5B shows a cross-section through line B-B' through drain 140B; and FIG. 5C shows a cross-sectional side view through line C-C' through gate electrode 125. Referring to FIG. 5B, the figure shows contact 165A connected to a top surface of source 140A (as viewed) and having projection 165A1 and projection 165A2 that contact respective opposing sidewalls of source 140A and extend past source 140A toward a base of fin 130.

FIGS. 6A-6C show the structure of FIGS. 5A-5C following the introduction (e.g., deposition) of a dielectric material on the interconnects on a device side of the structure and the inverting or flipping of the structure and connection of the structure to a carrier. FIGS. 6A-6C represent cross-sections through fin 130, drain 140B, and gate electrode 125, respectively, as described above with respect to FIGS. 3A-3C and FIGS. 5A-5C. Referring to FIGS. 6A-6C, in this embodiment, dielectric material 155B of, for example, silicon dioxide or a low k dielectric material is deposited as an ILD1 layer. Structure 100 is then flipped and connected at a device side to carrier 180 (device side down). Carrier 180 is, for example, a semiconductor wafer. Structure 100 may be connected to carrier 180 through an adhesive or other bonding technique between dielectric material 155B and carrier 180.

FIGS. 7A-7C show the structure of FIGS. 6A-6C following the removal or thinning of substrate 110 to expose a second side or backside of fin 130. In one embodiment, substrate 110 may be removed by a thinning process, such as a mechanical grinding or etch process. FIGS. 7A-7C show fin 130 exposed from a second side or backside of the structure. Following exposure of fin 130, the fin may optionally be recessed. FIGS. 7A-7C also show the structure following a recessing of fin 130. In one embodiment, to recess fin 130, an etch process may be utilized with an etchant selective toward a removal of fin material relative to dielectric material 155A. Alternatively, a masking material may be patterned on a surface of dielectric material 155 (an exposed backside surface) with an opening that exposes fin 130. A material of fin 130 may be removed to recess fin 130 by, for example, an etch process, and then the masking material removed.

FIGS. 8A-8C show the structure of FIGS. 7A-7C following the deposition of a dielectric material on a backside of fin 130. FIGS. 8A-8C show dielectric material 181 of, for example, a silicon dioxide or a low K dielectric material deposited by for example, a blanket deposition process. FIGS. 9A-9C show the structure of FIGS. 8A-8C following the patterning of dielectric material 181 to form contact openings in source and drain regions. Dielectric material 181 may be patterned by, for example, forming a masking material on a surface of dielectric material 181 with openings or vias opposite, for example, source and drain regions on an opposite side of fin 130. FIG. 9A shows opening 182A through dielectric material 181 oriented on a backside of fin 130 corresponding to a source region of the fin (source 140A) and opening 182B through dielectric material 181 corresponding to a drain region of the fin (drain 140B). FIG. 9B shows that the openings (e.g., opening 182A) have dimensions for a diameter that is greater than a width dimension of fin 130 and exposes ends of projection 1651A and projection 1652A of contact 165A.

Figures 10A, 10B, 10C:
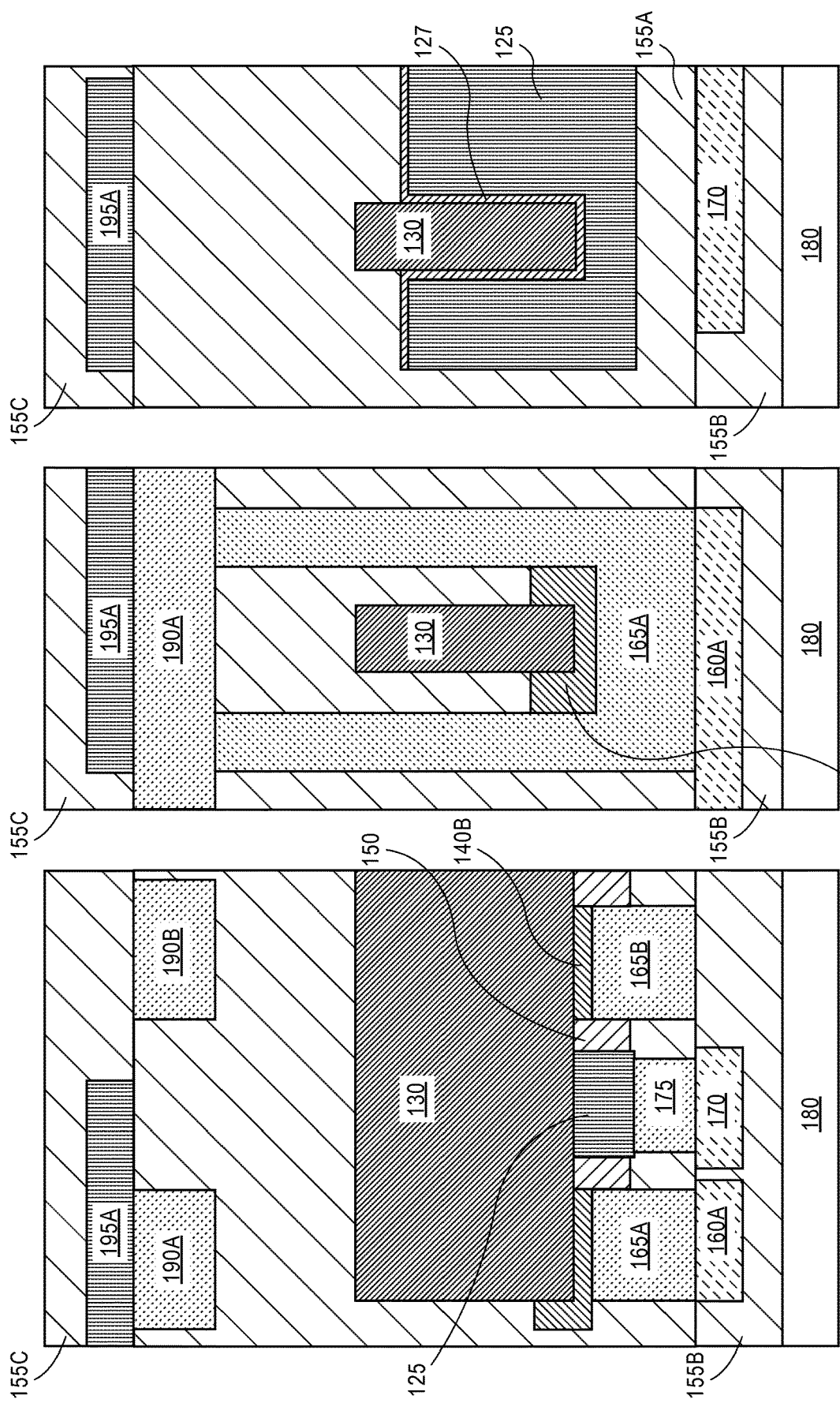
FIGS. 10A-10C show the structure of FIGS. 9A-9C following the filling of the via openings in dielectric material with a conductive contact material and show interconnects connected to the source contact as part of a first backside interconnect or metal layer.

FIGS. 10A-10C show the structure of FIGS. 9A-9C following the filling of the via openings in dielectric material 181 with a conductive contact material such as a tungsten. FIG. 10A shows contact 190A associated with source 140A and contact metal 190B associated with drain 140B. FIG. 10B shows contact metal 190A connected to projection 1651A and projection 1652A of contact 165A. FIG. 10B shows the connection to source 140A (via contact material)

from opposing sides of the structure (a first side or device side and a backside or second side) respectively. Interconnects may now be formed to contacts 190A and 190B by, for example, the technique described above with respect to device side interconnects (see FIGS. 4 and 5A-5C and the accompanying text). FIGS. 10A-10C shows interconnect 195A connected to contact 190A to source 140A as part of, for example, a first backside interconnect or metal layer. FIGS. 10A-10C also show the structure following the deposition of dielectric material 155C of silicon dioxide or a low k dielectric material on the interconnect or metal layer.

Figure 11:
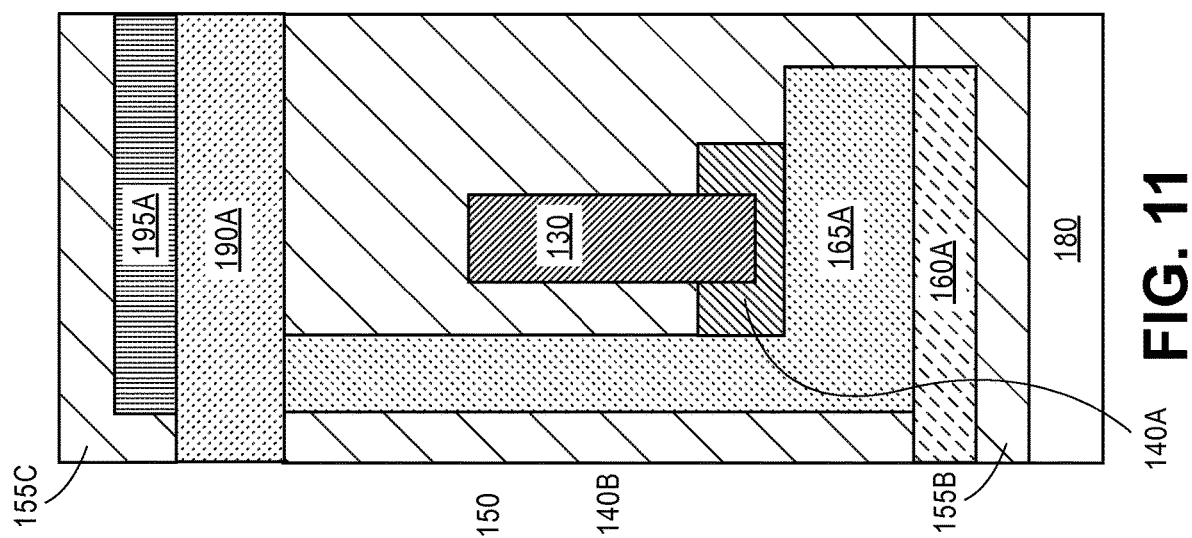
FIG. 11 shows a representative example of a cross-section through a source region of a three-dimensional transistor device having a contact extending from a first side of a device stratum to a second side of a device stratum only on one side of a fin in a source region.

In the embodiment of a structure described above with reference to FIGS. 1-10C, a backside metal contact was shown wrapped around opposite sides of a fin in a source and a drain, respectively. In another embodiment, a metal contact may be formed along only one side of a fin in a source and drain region, respectively. FIG. 11 shows a representative example of a cross-section through a source region of a three-dimensional transistor device having a contact extending from a first side of a device stratum to a second side of a device stratum only on one side of a fin in a source region. The reference numerals used are the same as in FIG. 10B. A process to form the structure shown in FIG. 11 would be similar to that shown in FIGS. 1-10C with only an opening being formed by way of, for example, a lithography process in dielectric material to expose a junction (source 140A) (see FIG. 2 and the accompanying text). Also, contact metal 190A could have a smaller width as it would not be necessary to, for example, extend across a width of a fin.

Figure 12:
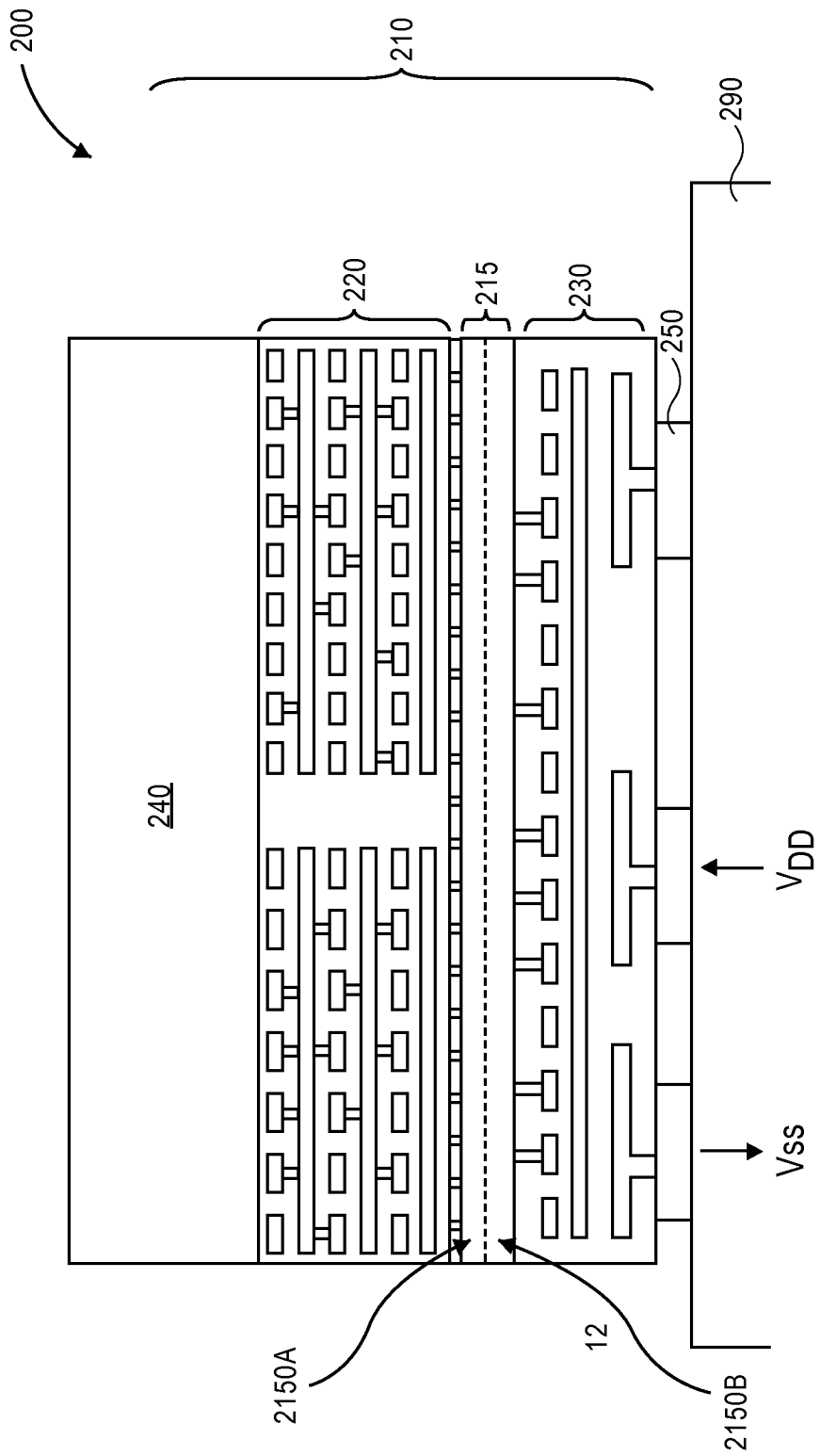
FIG. 12 shows a cross-sectional schematic side view of one embodiment of an assembly including an integrated circuit chip or die connected to a package substrate.

FIG. 12 shows a cross-sectional schematic side view of one embodiment of an assembly including an integrated circuit chip or die connected to a package substrate. Assembly 200 includes die 210 that may be formed as described above with reference to FIGS. 1-11. Die 210 includes device layer or stratum 215 including a number of devices (e.g., transistor devices). Device stratum 215 includes first side 2150A representing a first side of the stratum and second side or backside 2150B opposite first side 2150A. The transistor devices include, for example, one or more power transistors and logic circuitry. Connected to device stratum 215 of die 210 on a first side are interconnects 220 that, in one embodiment, include, but are not limited to, a number of conductive metal lines connected to devices of device stratum 215 from first side 2150A. With reference to FIGS. 1-11, interconnect 160A, interconnect 160B and interconnect 170 (see FIG. 4) are representative of a first level of interconnects 220 above device stratum 215. Disposed above interconnects 220, as viewed, is carrier substrate 240 that is similar to carrier substrate 180 described above with reference to FIGS. 6A-11. Connected to devices of die 210 through second side 2100B of the die, in this embodiment, are interconnects 230 that may be, for example, power interconnects ($V_{DD}$, $V_{DD}$-gated and $V_{SS}$), logic interconnects or both. Interconnects 230 on second side or backside 2100B include one or more levels or rows of metallization. With reference to FIGS. 10A-11, interconnect 195A is representative of a first level of interconnects 230 below device stratum 215. FIG. 12 also shows that ones of such level(s) of metallization are connected to contact points (e.g., C4 bumps) 250 that are operable to connect die 210 to package 290.C FIG. 12 further shows $V_{DD}$ and $V_{SS}$ connections to die 210 through package substrate 290.

Figure 13:
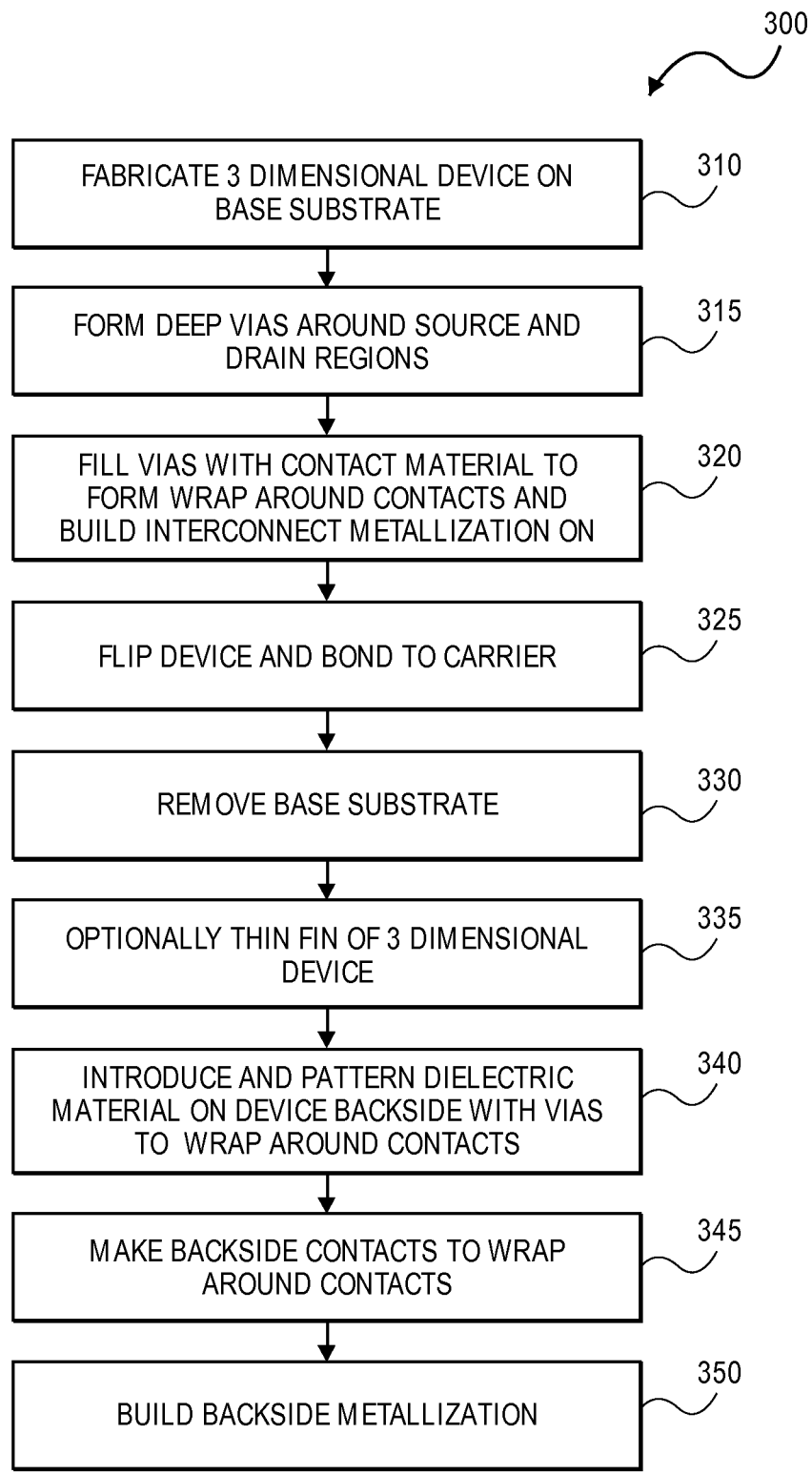
FIG. 13 is a flow chart of a process to form wrap around contacts to source and drains of a three-dimensional transistor device connected to backside metallization.

FIG. 13 is a flow chart of a process to form wrap around contacts to source and drains of a three-dimensional transistor device connected to backside metallization. Referring to FIG. 11, process 300 begins with the formation of a three-dimensional transistor device on a base substrate, the device including a fin extending from the base substrate and a source and drain formed in or on the fin (block 310). From a first side or device side of the structure, deep vias or openings are formed around source and drain regions of the device (block 315). The vias or openings are filled with contact material to form wrap around contacts and device side metallization is built (block 320). Following building of metallization, the device is flipped and bonded device side down to a carrier (block 325). The base substrate is then removed to expose the fin (block 330) and the fin is optionally recessed (block 335). Dielectric material is then introduced and patterned on a backside of the device with vias or openings to the wrap around contacts (block 340). The backside vias or openings are filled with contact material to make backside contacts to the wrap around contacts (block 345). Backside metallization is then optionally built (block 350).

The above embodiments are described with reference to a three-dimensional transistor device (e.g., a multi-gate device). In another embodiment, the description presented herein can be applied to other devices, such as planar devices or nanowire devices.

Figure 14:
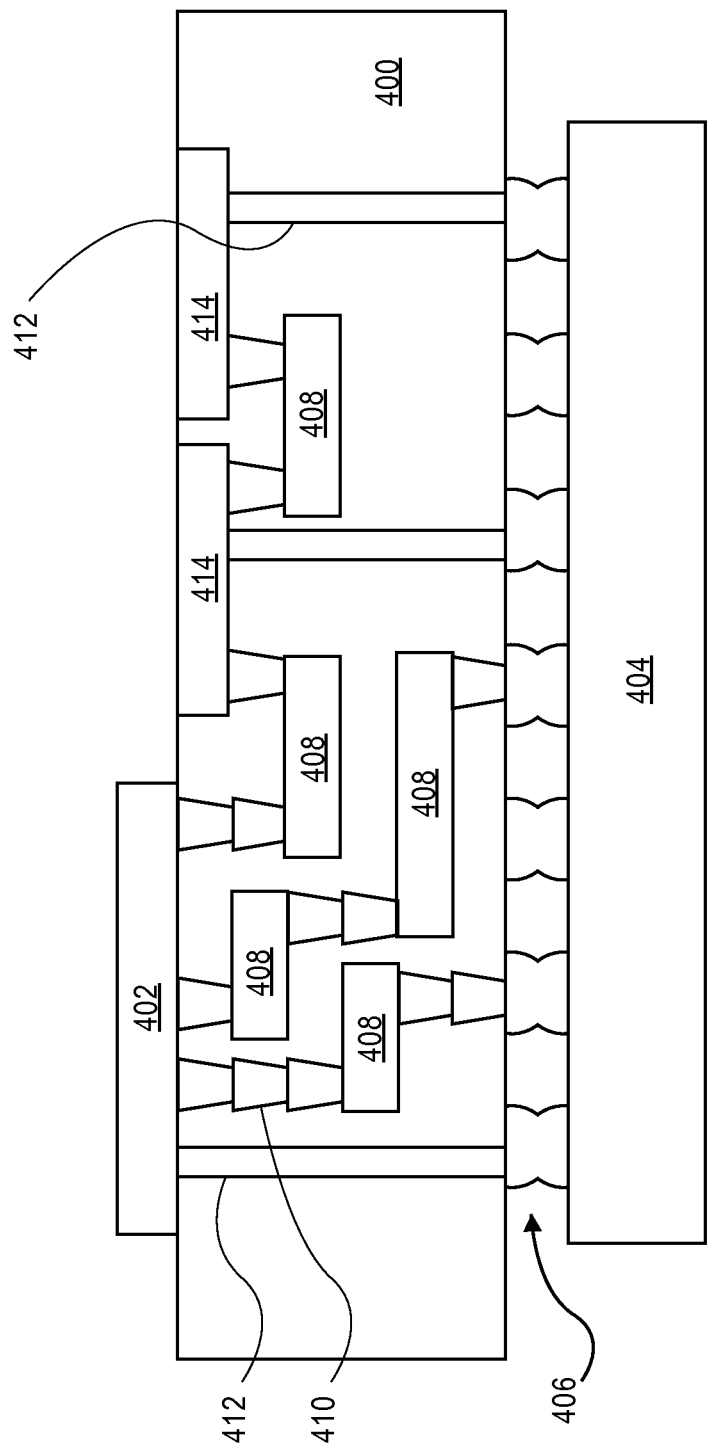
FIG. 14 is an interposer implementing one or more embodiments.

FIG. 14 illustrates interposer 400 that includes one or more embodiments. Interposer 400 is an intervening substrate used to bridge a first substrate 402 to second substrate 404. First substrate 402 may be, for instance, an integrated circuit die. Second substrate 404 may be, for instance, a memory module, a computer motherboard, or another integrated circuit die. Generally, the purpose of interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of interposer 400. In other embodiments, the first and second substrates 402/404 are attached to the same side of interposer 400. In further embodiments, three or more substrates are interconnected by way of interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 400.

In accordance with embodiments, apparatuses or processes disclosed herein may be used in the fabrication of interposer 400.

Figure 15:
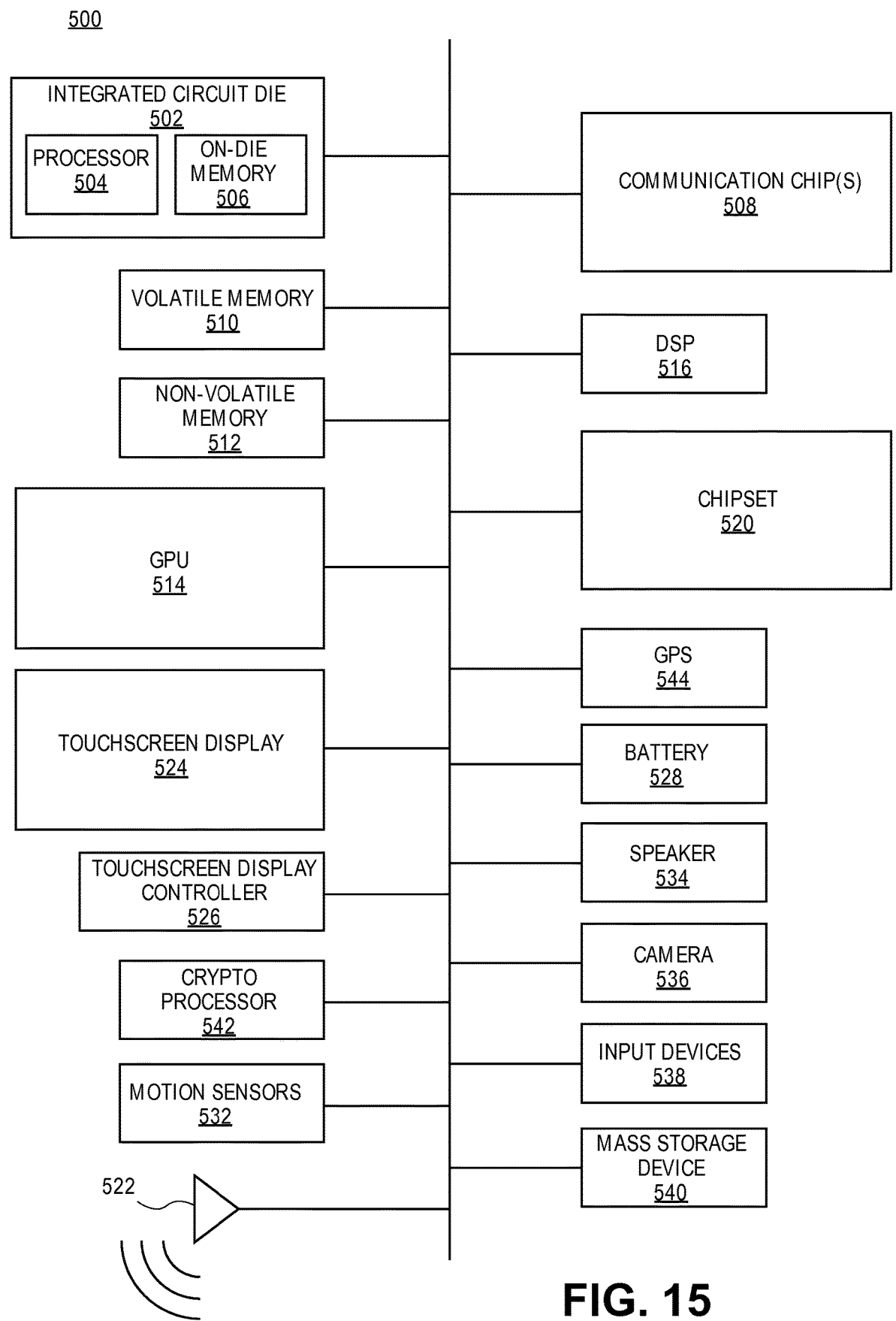
FIG. 15 illustrates an embodiment of a computing device.

FIG. 15 illustrates a computing device 500 in accordance with one embodiment. The computing device 500 may include a number of components. In one embodiment, these components are attached to one or more motherboards. In an alternate embodiment, these components are fabricated onto a single system-on-a-chip (SoC) die rather than a motherboard. The components in the computing device 500 include, but are not limited to, an integrated circuit die 502 and at least one communication chip 508. In some implementations the communication chip 508 is fabricated as part of the integrated circuit die 502. The integrated circuit die 502 may include a CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (a specialized processor that executes cryptographic algorithms within hardware), a chipset 520, an antenna 522, a display or a touchscreen display 524, a touchscreen controller 526, a battery 528 or other power source, a power amplifier (not shown), a global positioning system (GPS) device 544, a compass 530, a motion coprocessor or sensors 532 (that may include an accelerometer, a gyroscope, and a compass), a speaker 534, a camera 536, user input devices 538 (such as a keyboard, mouse, stylus, and touchpad), and a mass storage device 540 (such as hard disk drive, compact disk (CD), digital versatile disk (DVD), and so forth).

The communications chip 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 508. For instance, a first communication chip 508 may be dedicated to shorter range wireless communications such as Wi-Fi and Bluetooth and a second communication chip 508 may be dedicated to longer range wireless communications such as GPS, EDGE, GPRS, CDMA, WiMAX, LTE, Ev-DO, and others.

The processor 504 of the computing device 500 includes one or more devices, such as transistors or metal interconnects, that are formed in accordance with embodiments described above with wrap around contacts and optional backside metallization. The term "processor" may refer to any device or portion of a device that processes electronic data from registers and/or memory to transform that electronic data into other electronic data that may be stored in registers and/or memory.

The communication chip 508 may also include one or more devices, such as transistors or metal interconnects, that are formed in accordance with embodiments described above with wrap around contacts and optional backside metallization.

In further embodiments, another component housed within the computing device 500 may contain one or more devices, such as transistors or metal interconnects, that are formed in accordance with implementations described above with wrap around contacts and optional backside metallization.

In various embodiments, the computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

EXAMPLES

Example 1 is an apparatus including a circuit structure including a first side including a device layer including a plurality of devices and an opposite second side; an electrically conductive contact coupled to one of the plurality of devices on the first side; and an electrically conductive interconnect disposed on the second side of the structure and coupled to the conductive contact.

In Example 2, the device of the apparatus of Example 1 includes a body including a first sidewall and an opposing second sidewall, wherein the conductive contact is disposed on each of the first sidewall and the second sidewall.

In Example 3, the contact of the apparatus of Example 2 includes a first portion that is disposed on the first sidewall of the device and a second portion that is disposed on the second sidewall, wherein each of the first portion and the second portion separately extend from the device in a direction of the second side of the structure.

In Example 4, the contact of the apparatus of any of Examples 1-3 includes a device side contact, the apparatus further including a backside contact coupled to each of the first portion and the second portion of the device side contact, and wherein the interconnect is connected to the backside contact.

In Example 4, the interconnect of the apparatus of any of Examples 1-4 is a first interconnect, the apparatus further including a second electrically conductive interconnect coupled to the device from the first side of the structure.

In Example 5, the one of the plurality of devices of the apparatus of any of Examples 1-5 includes a non-planar transistor device including a source and a drain including a body including a first sidewall and an opposing second sidewall, wherein the contact is coupled to one of the source and drain and such coupling is disposed on each of the first sidewall and the second sidewall of the body.

Example 7 is a method including forming a transistor device including a channel between a source and a drain and a gate electrode on the channel defining a first side of the device; forming an electrically conductive contact to one of the source and the drain from the first side; and forming an interconnect on a second side of the device, wherein the interconnect is coupled to the contact.

In Example 8, the one of the source and the drain of the method of Example 7 includes a body including a first sidewall and an opposing second sidewall, wherein forming the contact includes disposing such contact on each of the first sidewall and the second sidewall of the body.

In Example 9, the first sidewall and the second sidewall of the method of any of Examples 7-8 are separated by a thickness dimension of the body and forming the contact includes bridging the thickness dimension.

In Example 10, the contact of the method of any of Examples 7-9 includes a device side contact, the method further including forming a backside contact coupled to each of the first portion and the second portion of the device side contact.

In Example 11, the interconnect of the method of any of Examples 7-10 includes coupling the interconnect to the backside contact.

In Example 12, forming the transistor device of the method of any of Examples 7-11 includes forming a fin on a substrate and the source and the drain in the fin separated by the channel and the gate electrode on the channel of the fin and after forming the transistor device, embedding opposing side portions of the fin in a dielectric material and prior to forming the contact, the method includes forming an opening in the dielectric material adjacent the opposing side portions of the fin and forming the contact includes forming the contact in the opening.

Example 12 is a method including forming a non-planar transistor device including a fin on a substrate and a source and a drain in the fin separated by a channel and a gate electrode on the channel of the fin defining a first side of the device; forming an electrically conductive contact to the transistor device from the first side; bonding the substrate to a carrier with the transistor device facing the carrier; removing the substrate to expose a second side of the device opposite the first side; and forming an interconnect to the contact from the second side of the device.

In Example 14, forming the contact to the transistor device of the method of Example 13 includes forming the contact to one of the source and the drain.

In Example 15, forming the contact of the method of Example 14 includes disposing such contact adjacent each of a first sidewall and a second sidewall of the fin.

In Example 16, the first sidewall and the second sidewall of the method of any of Examples 13-15 are separated by a thickness dimension of the fin and forming the contact includes bridging the thickness dimension.

In Example 17, the contact of the method of any of Examples 13-16 includes a device side contact with a first portion adjacent the first sidewall of the fin and a second portion adjacent the second sidewall of the fin, the method further including forming a backside contact coupled to each of the first portion and the second portion of the device side contact.

In Example 18, forming the interconnect of the method of any of Examples 13-17 includes coupling the interconnect to the backside contact.

In Example 19, after forming the transistor device, the method of any of Examples 13-18 includes embedding opposing side portions of the fin in a dielectric material and prior to forming the contact, the method includes forming an opening in the dielectric material adjacent the opposing side portions of the fin and forming the contact includes forming the contact in the opening.

In Example 20, the method of any of Examples 13-19 includes forming an interconnect to the transistor device from the first side of the device.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a circuit structure comprising a first side comprising a device layer comprising a plurality of devices and an opposite second side;
an electrically conductive contact coupled to a semiconductor body of one of the plurality of devices on the first side, the semiconductor body having a top surface, sidewalls, and a bottom surface, and the electrically conductive contact over the top surface of the semiconductor body, wherein the one of the plurality of devices comprises a non-planar transistor device comprising a source and a drain comprising the semiconductor body including a first sidewall and an opposing second sidewall, and wherein the electrically conductive contact is coupled to one of the source and drain and such coupling is disposed on each of the first sidewall and the second sidewall of the semiconductor body;
a first electrically conductive interconnect disposed on the second side of the structure and coupled to the electrically conductive contact;
a backside contact vertically between the electrically conductive contact and the first electrically conductive interconnect, the backside contact in direct contact with the electrically conductive contact and the first electrically conductive interconnect, wherein the backside contact extends laterally beneath the semiconductor body of the one of the plurality of devices on the first side, and wherein the backside contact meets the electrically conductive contact at a location beneath the bottom surface of the semiconductor body;
a dielectric material structure vertically between the backside contact and the semiconductor body, the dielectric material structure further along and in contact with the sidewalls of the semiconductor body; and
a second electrically conductive interconnect coupled to the one of the plurality of devices from the first side, the second electrically conductive interconnect over and directly on the electrically conductive contact.

2. The apparatus of claim 1, wherein the electrically conductive contact is disposed laterally adjacent to the sidewalls of the semiconductor body.

3. The apparatus of claim 2, wherein the electrically conductive contact comprises a first portion and a second portion, wherein each of the first portion and the second portion separately extend from the one of the plurality of devices in a direction of the second side of the structure.

4. The apparatus of claim 3, wherein the backside contact is coupled to each of the first portion and the second portion of the electrically conductive contact.

5. A computing device, comprising:
a board; and
a component coupled to the board, the component including an integrated circuit structure, comprising:
a circuit structure comprising a first side comprising a device layer comprising a plurality of devices and an opposite second side;
an electrically conductive contact coupled to a semiconductor body of one of the plurality of devices on the first side, the semiconductor body having a top surface, sidewalls, and a bottom surface, and the electrically conductive contact over the top surface of the semiconductor body, wherein the one of the plurality of devices comprises a non-planar transistor device comprising a source and a drain comprising the semiconductor body including a first sidewall and an opposing second sidewall, and wherein the electrically conductive contact is coupled to one of the source and drain and such coupling is disposed on each of the first sidewall and the second sidewall of the semiconductor body;

a first electrically conductive interconnect disposed on the second side of the structure and coupled to the conductive contact;

a backside contact vertically between the electrically conductive contact and the first electrically conductive interconnect, the backside contact in direct contact with the electrically conductive contact and the first electrically conductive interconnect, wherein the backside contact extends laterally beneath the semiconductor body of the one of the plurality of devices on the first side, and wherein the backside contact meets the electrically conductive contact at a location beneath the bottom surface of the semiconductor body;

a dielectric material structure vertically between the backside contact and the semiconductor body, the dielectric material structure further along and in contact with the sidewalls of the semiconductor body; and a second electrically conductive interconnect coupled to the one of the plurality of devices from the first side, the second electrically conductive interconnect over and directly on the electrically conductive contact.

6. The computing device of claim 5, further comprising: a memory coupled to the board.

7. The computing device of claim 5, further comprising: a communication chip coupled to the board.

8. The computing device of claim 5, further comprising: a camera coupled to the board.

9. The computing device of claim 5, further comprising: a battery coupled to the board.

10. The computing device of claim 5, further comprising: an antenna coupled to the board.

11. The computing device of claim 5, wherein the component is selected from the group consisting of a processor, a communications chip, and a digital signal processor.

12. The computing device of claim 5, wherein the computing device is selected from the group consisting of a mobile phone, a laptop, a desk top computer, a server, and a set-top box.

* * * * *